US012034053B2

(12) United States Patent
Loghmany et al.

(10) Patent No.: US 12,034,053 B2
(45) Date of Patent: Jul. 9, 2024

(54) OHMIC CONTACTS WITH DIRECT ACCESS PATHWAYS TO TWO-DIMENSIONAL ELECTRON SHEETS

(71) Applicant: NATIONAL RESEARCH COUNCIL OF CANADA, Ottawa (CA)

(72) Inventors: Alireza Loghmany, Kanata (CA); Jean-Paul Noel, Ottawa (CA); Elias Al-Alam, Gloucester (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 437 days.

(21) Appl. No.: 17/615,281

(22) PCT Filed: May 8, 2020

(86) PCT No.: PCT/IB2020/054395
§ 371 (c)(1),
(2) Date: Nov. 30, 2021

(87) PCT Pub. No.: WO2020/240310
PCT Pub. Date: Dec. 3, 2020

(65) Prior Publication Data
US 2022/0246737 A1 Aug. 4, 2022

Related U.S. Application Data

(60) Provisional application No. 62/854,425, filed on May 30, 2019.

(51) Int. Cl.
*H01L 29/417* (2006.01)
*H01L 21/285* (2006.01)
(Continued)

(52) U.S. Cl.
CPC .. *H01L 29/41766* (2013.01); *H01L 21/28587* (2013.01); *H01L 29/2003* (2013.01);
(Continued)

(58) Field of Classification Search
CPC ......... H01L 29/41766; H01L 21/28587; H01L 29/2003; H01L 29/205; H01L 29/66462;
(Continued)

(56) References Cited

U.S. PATENT DOCUMENTS 9,842,923 B2 * 12/2017 Banerjee ........... H01L 29/66462
10,665,463 B2 * 5/2020 Kudymov ............ H01L 23/482
(Continued)

FOREIGN PATENT DOCUMENTS

| CN | 109728086 A | 5/2019 |
| TW | 20053926 A | 12/2005 |
| TW | 201721865 A | 6/2017 |

OTHER PUBLICATIONS

Chaturvedi, N., et al. "Mechanism of ohmic contact formation in AlGaN/GaN high electron mobility transistors." Semiconductor Science and technology 21.2 (2006): 175.
(Continued)

*Primary Examiner* — J. E. Schoenholtz
(74) *Attorney, Agent, or Firm* — PERRY + CURRIER INC.

(57) ABSTRACT

An ohmic contact includes a first semiconductor layer a second semiconductor layer, and a heterointerface between the first semiconductor layer and the second semiconductor layer. The second semiconductor layer has a two-dimensional electron sheet region in which a two-dimensional electron sheet is formed. The ohmic contact further includes a metal terminal covering the first semiconductor layer and filling a plurality of direct access pathways that provide direct lateral contact with the two-dimensional electron sheet region. The semiconductor device is fabricated by providing the semiconductor layers, etching the direct access pathways, and depositing metal material to fill the direct access pathways and cover the semiconductor layers. The ohmic contact may be part of a high-electron-mobility
(Continued)

transistor that achieves low contact resistance with either no annealing at all (as-deposited metal), or at an anneal temperature that is much lower than industry-standard anneal temperatures to achieve sufficiently low contact resistance.

11 Claims, 8 Drawing Sheets

(51) Int. Cl.
  *H01L 29/20* (2006.01)
  *H01L 29/205* (2006.01)
  *H01L 29/66* (2006.01)
  *H01L 29/778* (2006.01)
(52) U.S. Cl.
  CPC ...... *H01L 29/205* (2013.01); *H01L 29/66462* (2013.01); *H01L 29/7786* (2013.01)
(58) Field of Classification Search
  CPC ........... H01L 29/7786; H01L 21/28575; H01L 23/4824
  See application file for complete search history.

(56) References Cited

U.S. PATENT DOCUMENTS

| | | | |
|---|---|---|---|
| 2007/0132037 A1* | 6/2007 | Hoshi | H01L 29/7787 257/E29.253 |
| 2008/0061441 A1 | 3/2008 | Liu | |
| 2008/0217625 A1 | 9/2008 | Kuroda et al. | |
| 2011/0233520 A1 | 9/2011 | Jeon et al. | |
| 2012/0223317 A1* | 9/2012 | Bahl | H01L 29/41766 257/E29.089 |
| 2012/0248500 A1 | 10/2012 | Kajitani | |
| 2013/0145619 A1 | 6/2013 | Lee | |
| 2014/0264454 A1 | 9/2014 | Banerjee et al. | |
| 2015/0179751 A1 | 6/2015 | Gaevski et al. | |
| 2016/0043187 A1* | 2/2016 | Saito | H01L 29/7786 257/76 |
| 2016/0118379 A1* | 4/2016 | Padmanabhan | H01L 27/0688 257/192 |
| 2016/0118535 A1 | 4/2016 | Lunev et al. | |
| 2018/0138306 A1* | 5/2018 | Jeon | H01L 29/66462 |
| 2020/0402975 A1* | 12/2020 | Rouviere | H01L 29/872 |
| 2021/0013336 A1* | 1/2021 | Jeon | H01L 29/872 |
| 2022/0189953 A1* | 6/2022 | Otake | H01L 29/7787 |
| 2022/0231157 A1* | 7/2022 | Wu | H01L 29/42316 |
| 2022/0406607 A1* | 12/2022 | Kudymov | H01L 29/41766 |
| 2023/0016810 A1* | 1/2023 | Loghmany | H01L 29/66462 |

OTHER PUBLICATIONS

Eastman, Lester F., et al. "Undoped AlGaN/GaN HEMTs for microwave power amplification." IEEE Transactions on Electron Devices 48.3 (2001): 479-485.
Liu, Y., et al. "Bias stress measurements on high performance AlGaN/GaN HFET devices." physica status solidi (a) 188.1 (2001): 233-237.
Bardwell, J. A., et al. "Comparison of two different Ti/Al/Ti/Au ohmic metallization schemes for AlGaN/GaN." Journal of Vacuum Science & Technology B: Microelectronics and Nanometer Structures Processing, Measurement, and Phenomena 20.4 (2002): 1444-1447.
Hajlasz, M., et al. "Characterization of recessed Ohmic contacts to AlGaN/GaN." Proceedings of the 2015 International Conference on Microelectronic Test Structures. IEEE, 2015.
Jacobs, B., et al. "Optimisation of the Ti/Al/Ni/Au ohmic contact on AlGaN/GaN FET structures." Journal of Crystal Growth 241.1-2 (2002): 15-18.
Mahajan, Somna S., et al. "Micro-structural evaluation of Ti/Al/Ni/Au ohmic contacts with different Ti/Al thicknesses in AlGaN/GaN HEMTs." Materials Science and Engineering: B 183 (2014): 47-53.
Qiao, D., et al. "Ta-based interface ohmic contacts to AlGaN/GaN heterostructures." Journal of Applied Physics 89.10 (2001): 5543-5546.
Bright, A. N., et al. "Correlation of contact resistance with microstructure for Au/Ni/Al/Ti/AlGaN/GaN ohmic contacts using transmission electron microscopy." Journal of Applied Physics 89.6 (2001): 3143-3150.
Xin, H. P., et al. "Optimization of AlGaN/GaN HEMT ohmic contacts for improved surface morphology with low contact resistance." CS Mantech Conf. 2010.
Liu, Q. Z., et al. "Study of contact formation in AlGaN/GaN heterostructures." Applied physics letters 71.12 (1997): 1658-1660.
Khan, Mohammad Rezaul Huque, et al. "A study on barrier height of Au—Al x Ga 1-x N schottky diodes in the range 0= x= 0.20." Solid State Electronics 2.41 (1997): 287-294.
Chu, Kenneth K., et al. "High speed high power AlGaN/GaN heterostructure field effect transistors with improved ohmic contacts." Compound Semiconductors 1997. Proceedings of the IEEE Twenty-Fourth International Symposium on Compound Semiconductors. IEEE, 1997.
Ruvimov, S., et al. "Microstructure of Ti/Al ohmic contacts for n-AlGaN." Applied Physics Letters 73.18 (1998): 2582-2584.
Liu, Q. Z., and S. S. Lau. "A review of the metal—GaN contact technology." Solid-State Electronics 42.5 (1998): 677-691.
Lim, S-H., et al. "Structural analysis of interfacial layers in Ti/Ta/Al ohmic contacts to n-AlGaN." Journal of Applied Physics 88.11 (2000): 6364-6368.
Yu, L. S., Qiao, D., et al. "Measurement of the Al mole fraction of bulk AlGaN and AlGaN/GaN heterostructure by photoconductance method." Journal of applied physics 86.5 (1999): 2696-2699.
Qiao, D., et al. "Contact Issues of GaN Technology." Materials Research Society Internet Journal of Nitride Semiconductor Research 4.S1 (1999): 49-56.
Youn, Chang-Joo, and Kwang-Yong Kang. "Low-resistance ohmic contacts to AlGaN/GaN heterostructure using Si/Ti/Al/Cu/Au multilayer metal scheme." Japanese Journal of Applied Physics 39.7R (2000): 3955.
Ingerly, Douglas B., et al. "Low resistance ohmic contacts to n-GaN and n-AlGaN using NiAl." Applied Physics Letters 77.3 (2000): 382-384.
Cordes, Holger, and Y. A. Chang. "Interfacial reactions and electrical properties of Ti/n-GaN contacts." Materials Research Society Internet Journal of Nitride Semiconductor Research 2 (1997).
Qiao, D., et al. "A study of the Au/Ni ohmic contact on p-GaN." Journal of Applied Physics 88.7 (2000): 4196-4200.
PCT/IB2020/054395, Ohmic Contacts with Direct Access Pathways to Two-Dimensional Electron Sheets, May 8, 2020.
U.S. Appl. No. 17/944,525, Ohmic Contacts with Direct Access Pathways to Two-Dimensional Electron Sheets, Sep. 14, 2022.

* cited by examiner

OHMIC CONTACTS WITH DIRECT ACCESS PATHWAYS TO TWO-DIMENSIONAL ELECTRON SHEETS

FIELD

The present specification relates to electrical junctions, and in particular to ohmic contacts for high-electron-mobility transistors (HEMTs).

BACKGROUND

An ohmic contact is an electrical junction which provides a substantially linear current-voltage curve between a metal electrical terminal and a semiconductor. An ohmic contact is generally designed to provide low ohmic contact resistance between the metal and the semiconductor without blockage due to rectification or excess power dissipation. Ohmic contacts are used extensively in electronic devices, including transistors, such as high-electron-mobility transistors (HEMTs).

A HEMT includes a metal drain contact terminal, a metal source contact terminal, and a gate contact terminal to which a voltage may be applied to control the flow of electrical current between the drain contact terminal and the source contact terminal. The amount of electrical current that may pass between the source and drain is determined by the voltage difference between them, by the concentration of electrons in a two-dimensional electron sheet, sometimes referred to as a two-dimensional electron gas or "2DEG" that forms at a channel between the ohmic contacts, and by the mobility of the electrons in the 2DEG. The concentration of electrons in the 2DEG is controlled by the voltage applied at the gate contact terminal.

SUMMARY

According to an aspect of the specification, an ohmic contact includes a first semiconductor layer of a first semiconductor material and a second semiconductor layer of a second semiconductor material. The second semiconductor material has a different band gap than the first semiconductor material and a heterointerface is formed between the first semiconductor layer and the second semiconductor layer. The second semiconductor layer includes a two-dimensional electron sheet region in which a two-dimensional electron sheet is formed. The semiconductor device further includes a plurality of direct access pathways passing through the first semiconductor layer to reach the two-dimensional electron sheet region, and a metal terminal covering the first semiconductor layer and filling the plurality of direct access pathways to make direct lateral contact with the two-dimensional electron sheet region.

According to another aspect of the specification, a method of fabricating an ohmic contact is provided. The method involves providing a first semiconductor layer of a first semiconductor material and a second semiconductor layer of a second semiconductor material, the second semiconductor material having a different band gap than the first semiconductor material and wherein a heterointerface is formed between the first semiconductor layer and the second semiconductor layer. The second semiconductor layer includes a two-dimensional electron sheet region in which a two-dimensional electron sheet is formed. The method further involves etching a plurality of direct access pathways passing through the first semiconductor layer to reach the two-dimensional electron sheet region, and depositing a metal material to fill the plurality of direct access pathways and to cover the first semiconductor layer to form a metal terminal making direct lateral contact with the two-dimensional sheet region.

According to yet another aspect of the specification, a high-electron-mobility transistor (HEMT) includes a drain contact terminal, a source contact terminal, and a gate contact terminal to receive a voltage to control a flow of electrical current between the drain contact terminal and the source contact terminal. The transistor further includes a barrier of a first semiconductor material and a channel of a second semiconductor material. The second semiconductor material has a different band gap than the first semiconductor material and a heterointerface is formed between the barrier and the channel. The channel includes a two-dimensional electron sheet region in which a two-dimensional electron sheet is formed. The transistor further includes a plurality of direct access pathways passing through the barrier to provide the drain contact terminal and the source contact terminal with direct lateral contact to the two-dimensional electron sheet region.

DETAILED DESCRIPTION

An ohmic contact may be fabricated by depositing one or more layers of a metal conductor onto layers of semiconductor materials. In the fabrication of semiconductor devices, including the fabrication of high-electron-mobility transistors (HEMTs), various techniques may be used to fabricate an ohmic contact to have low ohmic contact resistance between the metal conductor and the semiconductor material.

One technique to fabricate a low resistance ohmic contact for use in HEMTs is to anneal the ohmic contact at high temperatures (e.g. about 700° C. or higher) to promote desirable metallurgical reactions, including diffusion, thereby reducing resistance at the metal-semiconductor interface. Annealing an ohmic contact at such high temperatures can cause the ohmic contact to have poor edge definition, which degrades the performance of the HEMT, degrades the semiconductor, and leads to the occurrence of undesirable metallurgical or chemical reactions.

Another technique to fabricate a low resistance ohmic contact for use in HEMTs is to partially etch down the first semiconductor layer (i.e., the barrier) to produce a recessed ohmic area and reduce the distance to the heterointerface for both the source and drain contact terminals before the annealing step. However, there is difficulty in controlling the depth of the etching process. Further, the process of etching down the barrier may lead to non-uniformity of etching across the semiconductor wafer and to a lower concentration of electrons in the two-dimensional electron sheet in the recessed areas.

As discussed herein, a low resistance ohmic contact for a HEMT or other semiconductor device may be fabricated without annealing at high temperature and/or without partially etching down the thickness of the barrier. Rather, fabricating the ohmic contact involves etching a plurality of direct access pathways into the region in which a two-dimensional electron sheet is formed. These direct access pathways are then filled with one or more layers of metal material to form source and drain contact terminals. Since the source and drain contact terminals have pathways of direct lateral contact to the two-dimensional electron sheet region, the ohmic contact resistance of the HEMT or other semiconductor device is reduced.

Figure 1:
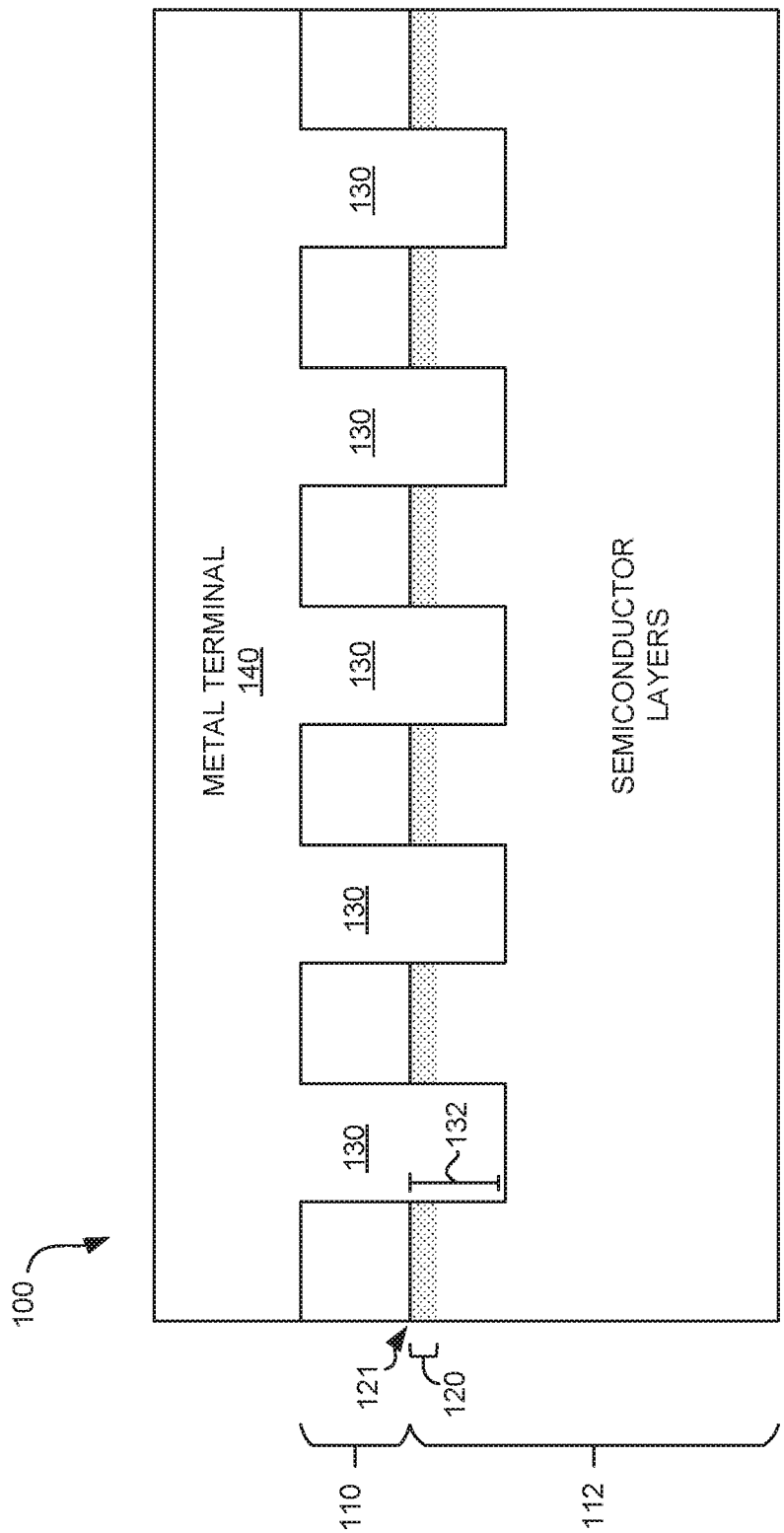
FIG. 1 is a schematic diagram of an example ohmic contact with direct access pathways to a two-dimensional electron sheet.

FIG. 1 is a schematic diagram of an example ohmic contact 100 with direct access pathways to a two-dimensional electron sheet. The ohmic contact 100 may be part of a high-electron-mobility transistor (HEMT) or other semiconductor device.

The ohmic contact 100 includes a first semiconductor layer 110 of a first semiconductor material and a second semiconductor layer 112 of a second semiconductor material, beneath the first semiconductor layer 110. The second semiconductor material has a different band gap than the first semiconductor material, and thus, a heterointerface 121 is formed between the first semiconductor layer 110 and the second semiconductor layer 112. The first semiconductor layer 110 may be referred to as the "barrier", whereas the second semiconductor layer 112 may be referred to as the "channel".

The second semiconductor layer 112 includes a region in which a two-dimensional electron sheet is formed, referred to herein as the two-dimensional electron sheet region 120. The two-dimensional electron sheet region 120 is in the second semiconductor layer 112 and adjacent to the heterointerface 121. The thickness of the two-dimensional electron sheet region 120 is exaggerated in the Figures for illustrative purposes, but it is to be understood that the thickness of the two-dimensional electron sheet region 120 may have a thickness of only about 1-2 nanometers.

The ohmic contact 100 further includes a plurality of direct access pathways 130 passing through the first semiconductor layer 110 to reach the two-dimensional electron sheet region 120. The direct access pathways 130 are etched into the first semiconductor layer 110, and travel past the first semiconductor layer 110 and past the two-dimensional electron sheet region 120.

The direct access pathways 130 are sufficiently spaced apart at the heterointerface 121 such that the concentration of electrons in the two-dimensional electron sheet is maintained. The shape and configuration of direct access pathways 130 may be of various designs, such as a series of parallel trenches, an array of polygonal holes, a series of laterally tapered trenches or a laterally tapered array of holes (e.g., starburst shape).

The ohmic contact 100 further includes a metal terminal 140 covering the first semiconductor layer 110 and filling the plurality of direct access pathways 130 to make direct lateral contact with the two-dimensional electron sheet region 120. The metal terminal 140 thus includes a plurality of fingers or prongs which fill the direct access pathways 130. If the ohmic contact 100 serves as part of a HEMT, the metal terminal 140 may be a source contact terminal or a drain contact terminal. With the metal terminal 140 making direct lateral contact with the two-dimensional electron sheet region 120, a low ohmic resistance of the ohmic contact 100 is achieved. Further, the surface area at the interface between the metal terminal 140 and the two-dimensional electron sheet region 120 is increased, further decreasing resistance.

Although it is sufficient that the direct access pathways 130 reach the two-dimensional electron sheet region 120 to provide the metal terminal 140 with direct access to the two-dimensional electron sheet, the direct access pathways 130 may travel past the heterointerface 121 by a buffer depth 132 to ensure that access to the two-dimensional electron sheet region 120 is provided despite minor variations in the fabrication process. Etching a buffer depth 132 past the heterointerface 121 may simplify and improve the reliability of fabricating techniques and decrease the likelihood that imperfections in fabricating techniques will result in some of the direct access pathways 130 not reaching the two-dimensional electron sheet.

It is to be understood that the thickness of the two-dimensional electron sheet in the two-dimensional electron sheet region 120 may have such little thickness, for example, 1-2 nanometers of thickness, that practically any direct access pathway 130 which makes contact with the two-dimensional electron sheet region 120 will exceed the heterointerface 121 by a buffer depth 132. For example, the thickness of the first semiconductor layer 110 may be about twenty nanometers, the thickness of the two-dimensional electron sheet region 120 may be about two nanometers, and the buffer depth 132 may be any depth which ensures reliable etching past the heterointerface 121 without compromising other layers of the ohmic contact. The depth of the buffer 132 can therefore vary from about 2 nm to 100 s of nm.

If the ohmic contact 100 serves as part of a HEMT, the first semiconductor material may be selected to serve as a HEMT barrier, and the second semiconductor material may be selected to serve as a HEMT channel compatible with the barrier, as appropriate. For example, a preferred first semiconductor material may include aluminum gallium nitride (AlGaN) as the barrier and a preferred second semiconductor material may include gallium nitride (GaN) as the channel. Other combinations of barriers and channels are contemplated. For example, the first semiconductor material may include aluminum gallium arsenide (AlGaAs) as the barrier, and the second semiconductor material may include gallium arsenide (GaAs) as the channel. Other examples include InAlN or InAlGaN as the barrier with GaN as the channel, or InP HEMTs with InAlAs as the barrier and InGaAs as the channel.

Figure 2:
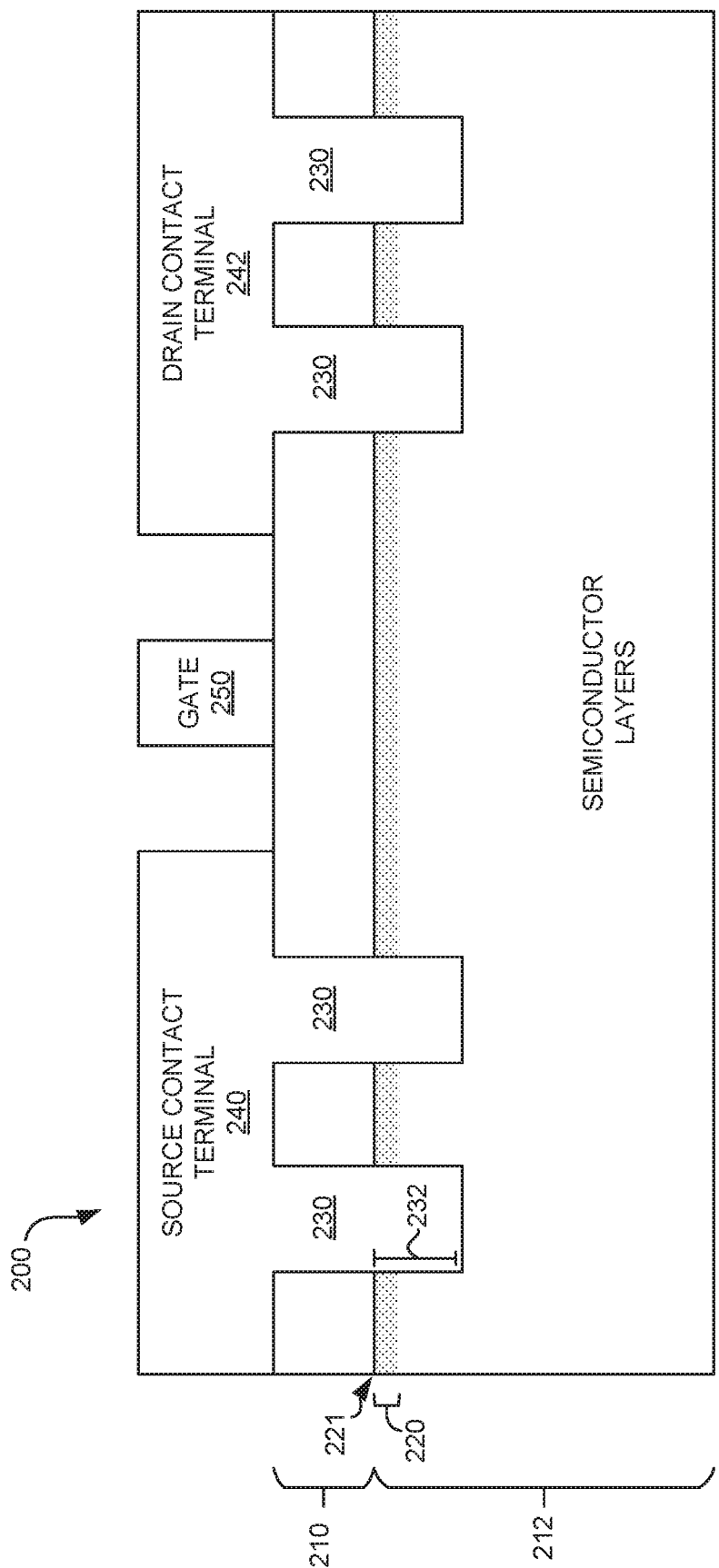
FIG. 2 is a schematic diagram of an example high-electron-mobility transistor (HEMT) with direct access pathways to a two-dimensional electron sheet.

FIG. 2 is a schematic diagram of an example high-electron-mobility transistor (HEMT), referred to herein as transistor 200, with direct access pathways from terminals laterally to a two-dimensional electron sheet. Parts of the transistor 200 may be similar to the ohmic contact 100 of FIG. 1, as will be seen below.

The transistor 200 includes a source contact terminal 240, a drain contact terminal 242, and a gate contact terminal 250. The source contact terminal 240 and drain contact terminal 242 are metal conductors. The transistor 200 further includes a barrier 210 of a first semiconductor material, and a channel 212 of a second semiconductor material underneath the barrier 210. The barrier 210 and channel 212 form layers that run continuously beneath the source contact terminal 240, drain contact terminal 242, and gate contact terminal 250 (the continuous path is not shown in the cross-section of FIG. 2, because it is out of the plane). The gate contact terminal 250 rests on top of the barrier 210 or on a thin insulator layer (the latter not shown), forming either a Schottky contact or metal-insulator-semiconductor structure that is situated between the source contact terminal 240 and drain contact terminal 242. The source-gate spacing and the gate-drain spacing need not be equivalent.

The second semiconductor material has a different band gap than the first semiconductor material, and thus a heterointerface 221 is formed between the barrier 210 and the channel 212. The channel 212 includes a region in which a two-dimensional electron sheet is formed, referred to herein as the two-dimensional electron sheet region 220. The two-dimensional electron sheet region 220 is in the channel 212 and adjacent to the heterointerface 221. The thickness of the two-dimensional electron sheet region 220 is exaggerated in the Figures for illustrative purposes, but it is to be understood that the thickness of the two-dimensional electron sheet region 220 may have a thickness of only about 1-2 nanometers. Further, it is to be understood that the channel 212 is an upper portion of a deeper layer of the second semiconductor material, below which may include the substrate wafer and any additional layer(s) epitaxially grown (not shown in FIG. 2) to accommodate lattice mismatch between the substrate wafer and the channel 212.

When a first voltage source is used to apply a voltage greater than a threshold voltage to the gate contact terminal 250, electrons accumulate in a two-dimensional electron sheet region 220, thereby allowing electrical current to flow between the source contact terminal 240 and drain contact terminal 242 when a second voltage source is used to apply a voltage difference between the source and drain.

The first semiconductor material is selected to serve as a HEMT barrier and the second semiconductor material is selected to serve as a HEMT channel compatible with the barrier. For example, a preferred first semiconductor material may include aluminum gallium nitride (AlGaN) and a preferred second semiconductor material may include gallium nitride (GaN). Other combinations of barriers and substrates are contemplated. For example, the first semiconductor material may include aluminum gallium arsenide (AlGaAs), and the second semiconductor material may include gallium arsenide (GaAs). The selection of semiconductor materials may be made so that the transistor 200 acts as a depletion-mode HEMT. Other example combinations are discussed above with reference to FIG. 1. A thin spacer layer of aluminum nitride (AlN) may be incorporated between the barrier and the GaN channel, in order to boost the 2DEG concentration even further (owing to the favorable conduction band energy discontinuities between the materials) and/or to improve the 2DEG mobility by keeping the tail of the electron distribution/wavefunction within the ordered alloy (AlN) rather than letting it spill into the random alloy (e.g. AlGaN, with Al and Ga at random locations on the metal sublattice), which provides a scattering mechanism for electrons not contained completely within the ordered GaN channel.

The transistor 200 further includes a plurality of direct access pathways 230 passing through the barrier 210 to provide the source contact terminal 240 and the drain contact terminal 242 with direct lateral contact to the two-dimensional electron sheet in the two-dimensional electron sheet region 220.

Thus, it may be seen that the terminals 240, 242, barrier 210, channel 212, two-dimensional electron sheet region 220, and direct access pathways 230 may be similar to elements of the ohmic contact 100 of FIG. 1, and thus, further description of these elements may be had with reference to the description of the ohmic contact of 100 of FIG. 1. For example, it may be seen that the direct access pathways 230 travel past the heterointerface 221 by a buffer depth 232, thereby providing the benefits discussed above with respect to the buffer depth 132 of the ohmic contact 100 of FIG. 1. Further, as discussed with reference to the ohmic contact 100 of FIG. 1, the direct access pathways 130 may be etched in various configurations such as a series of parallel trenches, an array of polygonal holes, a series of laterally tapered trenches or a laterally tapered array of holes (e.g., starburst shape).

Figure 3:
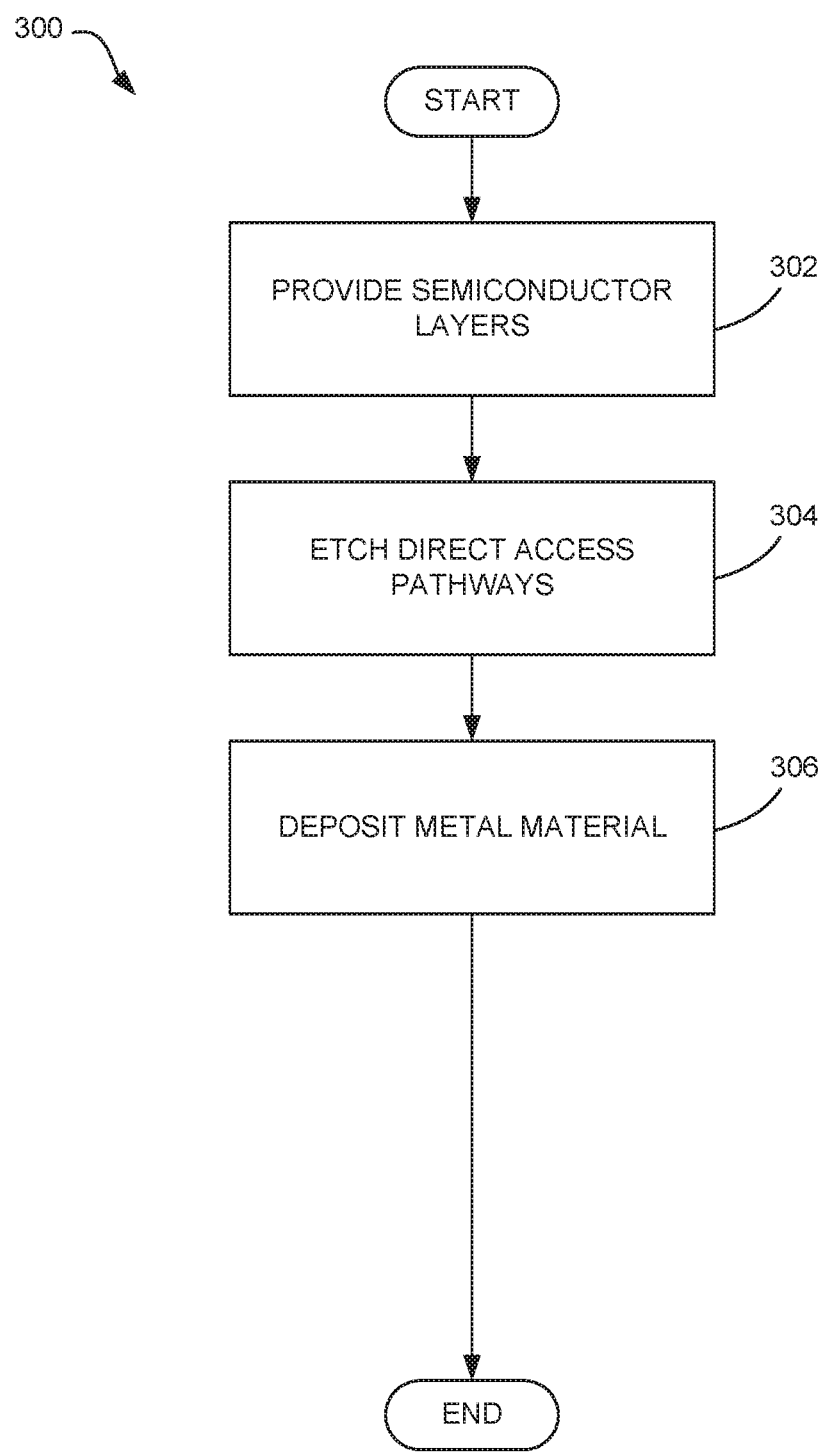
FIG. 3 is a flowchart of an example method for fabricating an ohmic contact with direct access pathways to a two-dimensional electron sheet.

FIG. 3 is a flowchart of an example method 300 for fabricating an ohmic contact with direct access pathways to a two-dimensional electron sheet. The method 300 may be applied to fabricate the ohmic contact 100 of FIG. 1, an ohmic contact for a high-electron-mobility transistor (HEMT) such as the transistor 200 of FIG. 2. This is not limiting and the method 300 may be applied to fabricate other semiconductor devices.

Figure 4A:
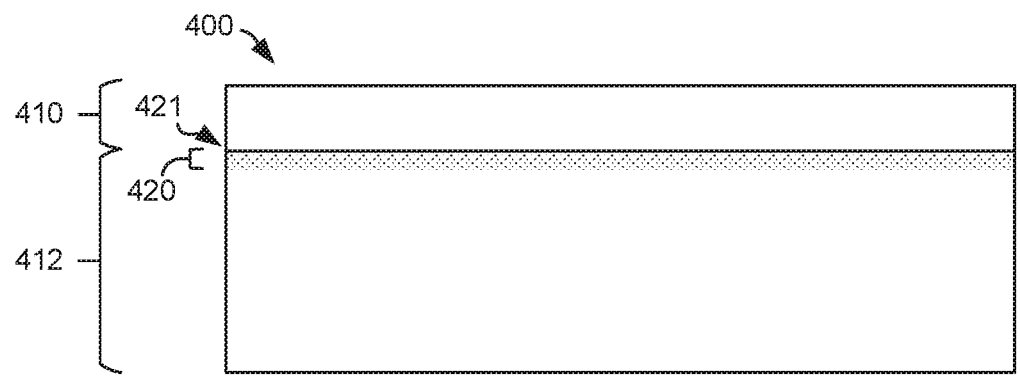
FIG. 4A is a schematic diagram of a first stage of fabrication of an example ohmic contact with direct access pathways to a two-dimensional electron sheet, prior to etching of the direct access pathways.
Figure 4B:
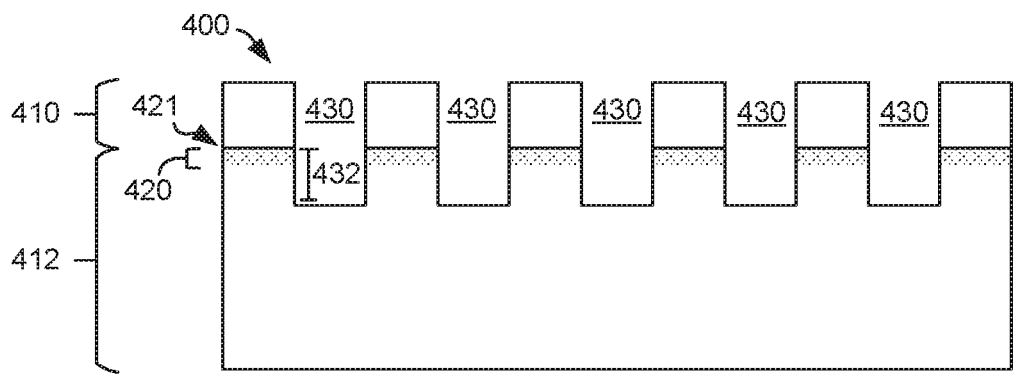
FIG. 4B is a schematic diagram of a second stage of fabrication of the ohmic contact of FIG. 4A with direct access pathways etched therein.
Figure 4C:
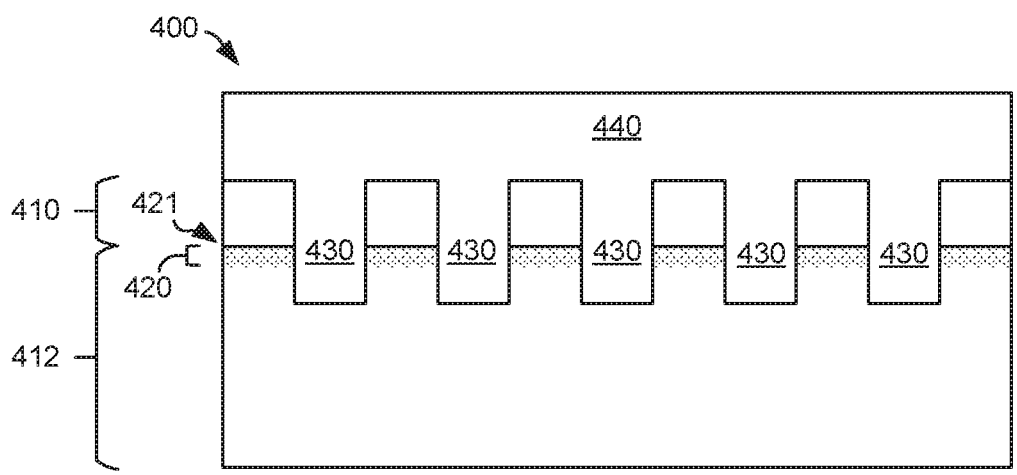
FIG. 4C is a schematic diagram of a third stage of fabrication of the ohmic contact of FIG. 4A with direct access pathways etched therein and a metal terminal layer deposited thereon which fills the direct access pathways.

Certain stages of fabrication of an ohmic contact 400 for use in an ohmic contact are shown in FIGS. 4A, 4B, and 4C. The stages of fabrication corresponding to blocks 302, 304, and 306 of the method 300 are depicted in FIGS. 4A, 4B, and 4C, respectively, which may be referenced along with the description of method 300. The method 300 is not dependent on temperature as it does not involve an annealing process. Thus, the method may be performed at range of temperatures lower than the temperatures used in annealing processes, such as below about 600° C., or at room temperature.

At block 302, a first semiconductor layer 410 and a second semiconductor layer 412 of the ohmic contact 400 are provided. The first semiconductor layer 410 is of a first semiconductor material, and the second semiconductor layer 412 is of a second semiconductor material. The second semiconductor material has a different band gap than the first semiconductor material and a heterointerface 421 is formed between the first semiconductor layer 410 and the second semiconductor layer 412. Examples of semiconductor materials are provided above with respect to the ohmic contact 100 of FIG. 1 and the transistor 200 of FIG. 2. The second semiconductor layer 412 includes a two-dimensional electron sheet region in which a two-dimensional electron sheet is formed.

At block 304, a plurality of direct access pathways 430 passing through the first semiconductor layer 410 to reach the two-dimensional electron sheet region 420 is etched.

The direct access pathways 430 are etched into the first semiconductor layer 410, and travel past the first semiconductor layer 410 and past the heterointerface 421. Further, the direct access pathways 430 may travel past the heterointerface 421 by a buffer depth 432 to ensure that access to the two-dimensional electron sheet region 420 is provided despite minor variations in the fabrication process.

The etching may involve resist patterning by electron beam lithography, or other means for lithographic pattern transfer, which may be used to etch the direct access pathways 430 with precision at the nanometer scale. For example, electron beam lithography may be used to pattern the subsequent mask which is etched through a first layer of semiconductor material (e.g. AlGaN) with a thickness of about 20 nanometers, providing a buffer depth 432 of about 2 to 100 s of nanometers.

The direct access pathways 430 may be of any suitable shape and configuration compatible with the etching technique used provided that the direct access pathways 430 provide sufficient direct lateral contact between the metal terminal 440 and the two-dimensional electron sheet region 420 to achieve a desired ohmic contact resistance. Ohmic contacts fabricated with direct access pathways 430 as discussed herein may achieve ohmic contact resistance below about 5 ohm-mm, preferably below about 1 ohm-mm, more preferably below about 0.5 ohm-mm, and most preferably below about 0.1 ohm-mm, without an annealing process.

As an example configuration, the direct access pathways 430 may include a series of parallel trenches. That is, the direct access pathways 430 may be substantially rectangular in cross-section. Thus, etching the plurality of direct access pathways 430 may involve etching a series of parallel trenches.

Non-uniformities in the fabrication process may result in not all of the direct access pathways 430 reaching the two-dimensional electron sheet region 420. To compensate for such non-uniformities, etching the direct access pathways 430 as a series of trenches provides good coverage of the ohmic contact in addition to redundancy between any trenches which fail to make direct lateral contact with the two-dimensional electron sheet region 420. Further, etching the direct access pathways 430 as a series of parallel trenches may simplify the fabrication process.

Figure 5:
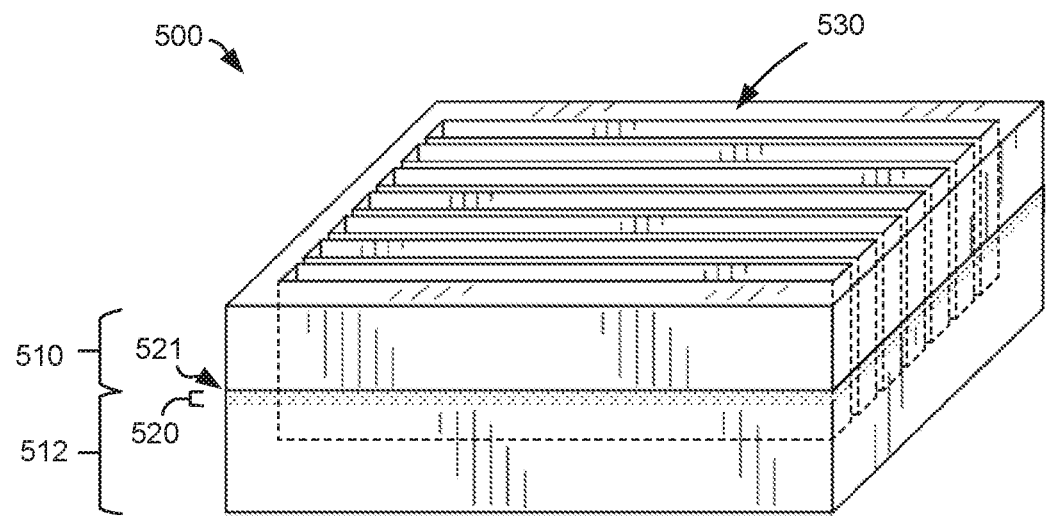
FIG. 5 is a perspective view of an ohmic contact with a series of parallel trenches to serve as direct access pathways to a two-dimensional electron sheet.

An example of an ohmic contact having with a series of parallel trenches to serve as direct access pathways between a terminal and a two-dimensional electron sheet region is shown in FIG. 5, indicated generally at 500. The ohmic contact 500 includes a first semiconductor layer 510, a second semiconductor layer 512, a heterointerface 521, a two-dimensional electron sheet region 520, and a series of parallel trenches 530.

Figure 6:
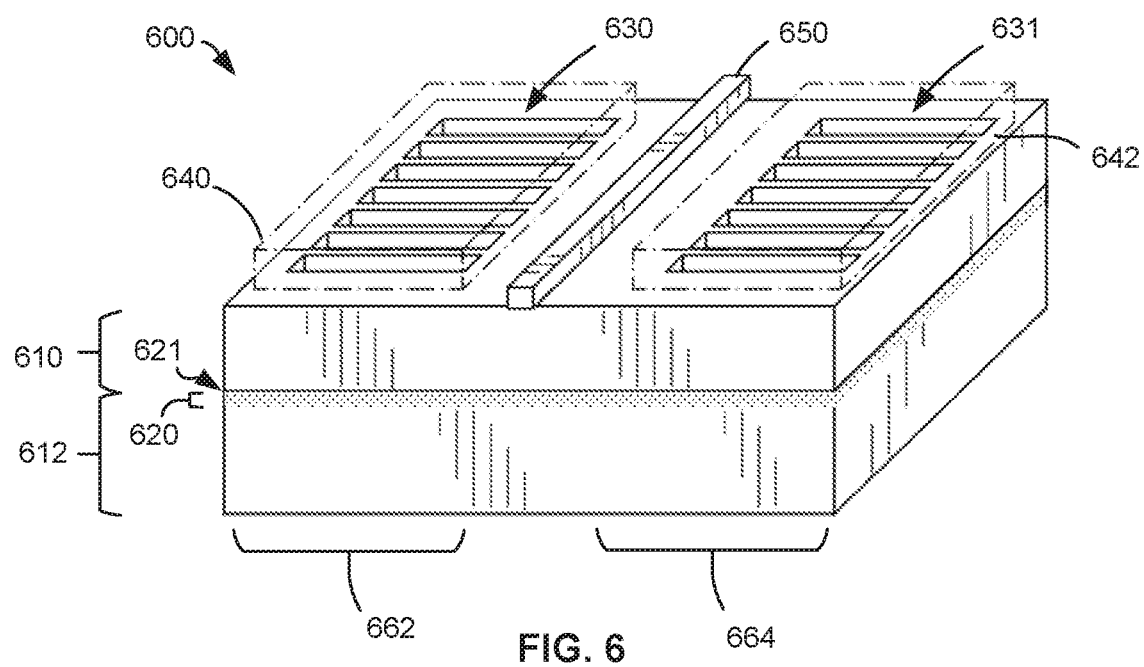
FIG. 6 is a perspective view of an example HEMT having source and drain ohmic contacts with a series of parallel trenches thereunder serving as direct access pathways to a two-dimensional electron sheet.

Further, an example of a HEMT with a series of parallel trenches serving as direct access pathways between two contact terminals and a two-dimensional electron sheet is shown in FIG. 6, indicated generally at 600. The transistor 600 includes a first semiconductor layer 610, a second semiconductor layer 612, a heterointerface 621, a two-dimensional electron sheet region 620, a source contact terminal 640, a drain contact terminal 642, a gate contact terminal 650, and series of parallel trenches 630, 631, beneath the terminals 640, 642, respectively. The terminals 640, 642 are shown in broken lines for viewing of the trenches 630, 631.

In the transistor 600, a first ohmic contact 662 is formed by the source contact terminal 640, series of parallel trenches 630, and portions of the first semiconductor layer 610, heterointerface 621, two-dimensional electron sheet region 620, and second semiconductor layer 612 underneath the source contact terminal 640. A second ohmic contact 664 is formed by the drain contact terminal 642, series of parallel trenches 631, and portions of the first semiconductor layer 610, heterointerface 621, two-dimensional electron sheet region 620, and second semiconductor layer 612 underneath the drain contact terminal 642.

Returning to FIG. 3 and FIGS. 4A, 4B, and 4C, as another example configuration of the direct access pathways 430, the direct access pathways 430 may include an array of spaced polygonal holes, such as hexagonally shaped holes. That is, the direct access pathways 430 may be substantially hexagonal in cross-section. Thus, etching the plurality of direct access pathways 430 may involve etching an array of spaced polygonal holes, such as hexagonal holes. Etching the direct access pathways 430 as an array of spaced polygons provides good coverage of the ohmic contact, and redundancy as between the holes.

Figure 7:
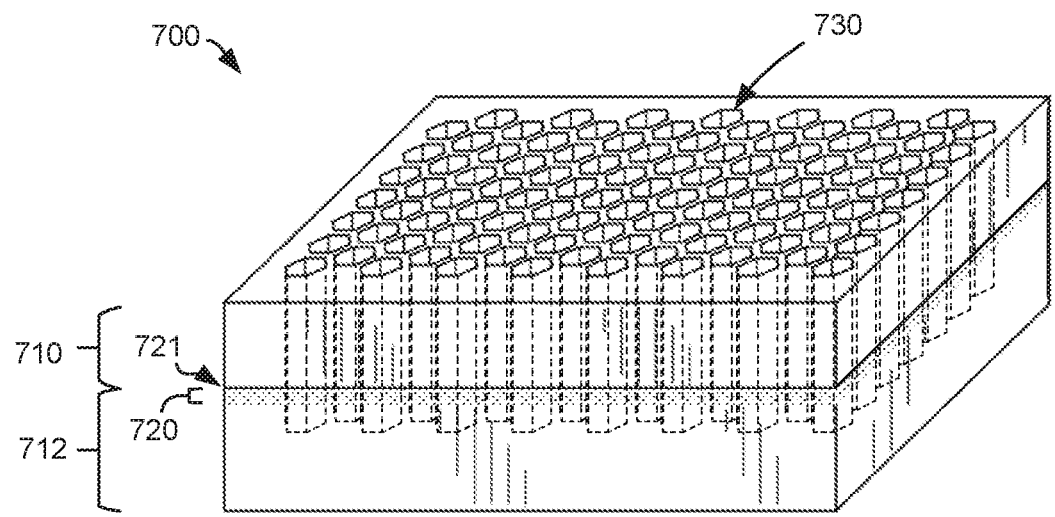
FIG. 7 is a perspective view of an example ohmic contact with an array of hexagonal holes to serve as direct access pathways to a two-dimensional electron sheet.

An example of an ohmic contact having with an array of spaced hexagonal holes to serve as direct access pathways between an electrode and a two-dimensional electron sheet is shown in FIG. 7, indicated generally at 700. The ohmic contact 700 includes a first semiconductor layer 710, a second semiconductor layer 712, a heterointerface 721, a two-dimensional electron sheet region 720, and an array of spaced hexagonal holes 730.

Figure 8:
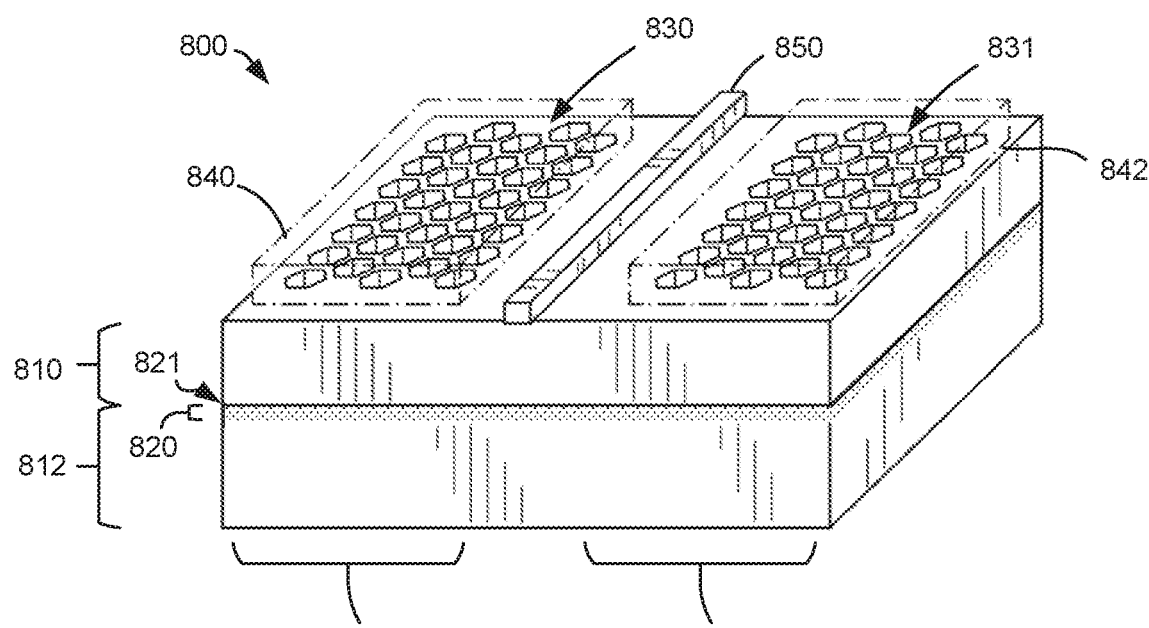
FIG. 8 is a perspective view of an example HEMT having source and drain ohmic contacts with arrays of hexagonal holes thereunder serving as direct access pathways to a two-dimensional electron sheet.

Further, an example of a HEMT with an array of spaced hexagonal holes serving as direct access pathways between two metal terminals and a two-dimensional electron sheet is shown in FIG. 8, indicated generally at 800. The transistor 800 includes a first semiconductor layer 810, a second semiconductor layer 812, a heterointerface 821, a two-dimensional electron sheet region 820, a source contact terminal 840, a drain contact terminal 842, a gate contact terminal 850, and arrays of hexagonal holes 830, 831, beneath the terminals 840, 842, respectively. The terminals 840, 842 are shown in broken lines for viewing of the holes 830, 831.

In the transistor 800, a first ohmic contact 862 is formed by the source contact terminal 840, array of hexagonal holes 830, and portions of the first semiconductor layer 810, heterointerface 821, two-dimensional electron sheet region 820, and second semiconductor layer 812 underneath the source contact terminal 840. A second ohmic contact 864 is formed by the drain contact terminal 842, array of hexagonal holes 831, and portions of the first semiconductor layer 810, heterointerface 821, two-dimensional electron sheet region 820, and second semiconductor layer 812 underneath the drain contact terminal 842.

Returning to FIG. 3 and FIGS. 4A, 4B, and 4C, it is noted that other configurations of the direct access pathways are contemplated, including fins, arrays of channels with other polygonal cross-sections, and other configurations. Further, as a consequence of the etching technique used, the direct access pathways 430 may have inner walls which are not uniform throughout the depth of the direct access pathways 430 as illustrated. That is, the cross-sectional area of the direct access pathways 430 may vary with depth. For example, a direct access pathway 430 may become narrower or wider as it travels toward the two-dimensional electron sheet region 420.

The surface of the first semiconductor layer 410 is to be etched with direct access pathways 430 to sufficient degree to achieve a desired ohmic contact resistance while maintaining the two-dimensional electron sheet at the two-dimensional electron sheet region 420. That is, the proportion of the ohmic contact occupied by the direct access pathways 430 is sufficiently great to provide low ohmic resistance but sufficiently small to allow the formation of the two-dimensional electron sheet at the two-dimensional electron sheet region 420.

Examples of direct access pathways 430 that are laterally tapered are shown in FIGS. 9-12, and which benefit from multiple direct contacts to the two-dimensional electron sheet region to form an Ohmic contact with additionally lowered resistance, and lower annealing temperatures. An additional advantage of providing multiple direct contacts to the two-dimensional electron sheet region, is that the surface area of the contact also is larger compared to conventional the contact surface area.

Figure 9:
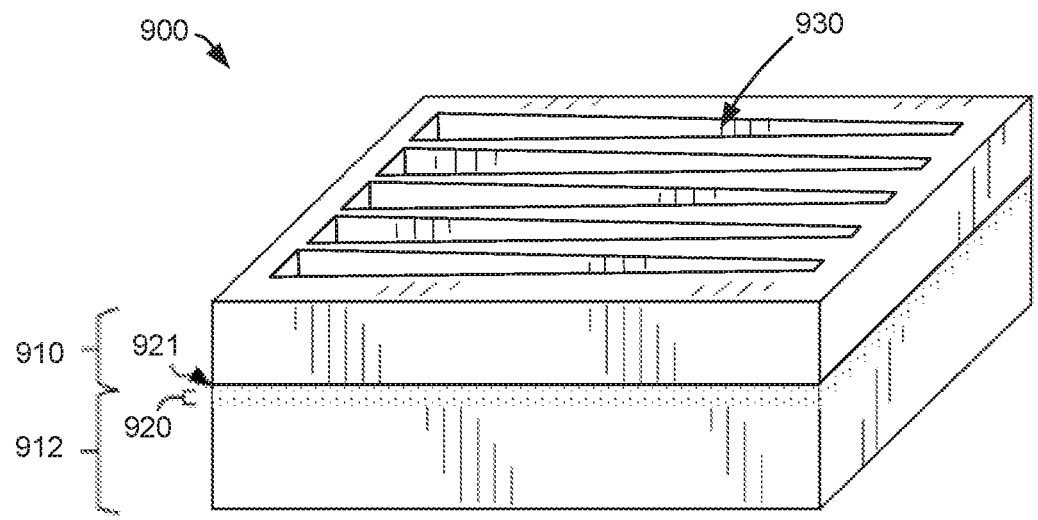
FIG. 9 is a perspective view of an ohmic contact with a series of laterally tapered trenches to serve as direct access pathways to a two-dimensional electron sheet.

An example of an ohmic contact having with a series of laterally tapered trenches to serve as direct access pathways between a terminal and a two-dimensional electron sheet region is shown in FIG. 9, indicated generally at 900. The ohmic contact 900 includes a first semiconductor layer 910, a second semiconductor layer 912, a heterointerface 921, a two-dimensional electron sheet region 920, and a series of laterally tapered trenches 930.

Figure 10:
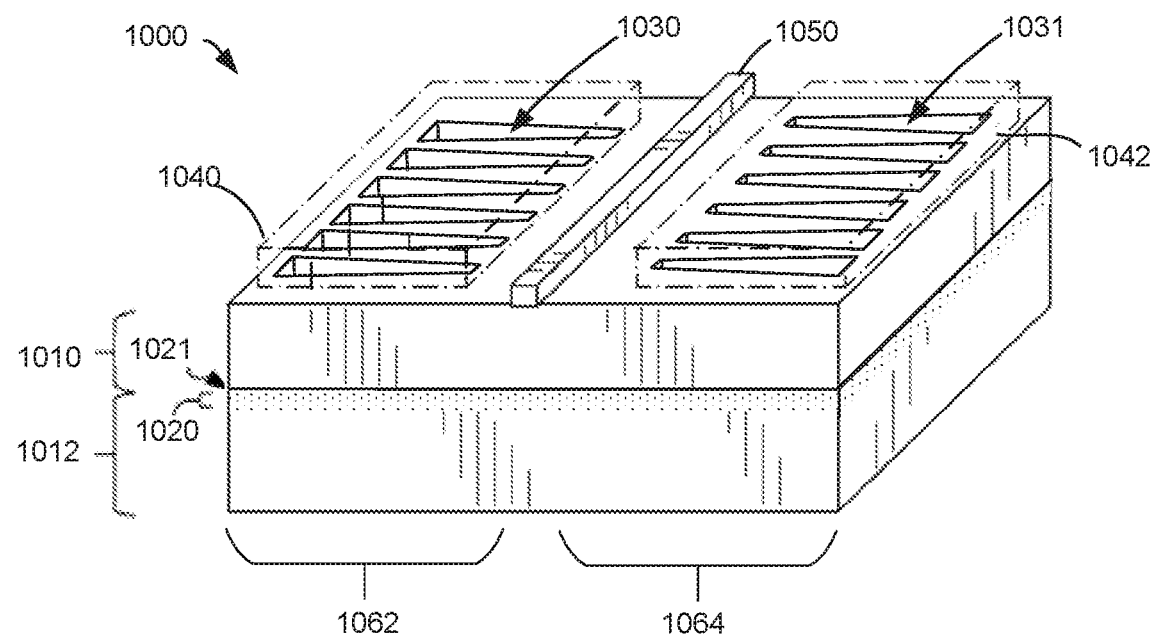
FIG. 10 is a perspective view of an example HEMT having source and drain ohmic contacts with a series of laterally tapered trenches thereunder serving as direct access pathways to a two-dimensional electron sheet.

Further, an example of a HEMT with a series of laterally tapered trenches serving as direct access pathways between two contact terminals and a two-dimensional electron sheet is shown in FIG. 10, indicated generally at 1000. The transistor 1000 includes a first semiconductor layer 1010, a second semiconductor layer 1012, a heterointerface 1021, a two-dimensional electron sheet region 1020, a source contact terminal 1040, a drain contact terminal 1042, a gate contact terminal 1050, and series of laterally tapered trenches 1030, 1031, beneath the terminals 1040, 1042, respectively. The terminals 1040, 1042 are shown in broken lines for viewing of the trenches 1030, 1031.

The series of laterally tapered trenches 1030, 1031 provide direct electrical contact to large lengths of exposed heterointerface 1021 along the sidewalls of the trenches, thereby giving electrical contact access to the two-dimensional electron sheet region 1020. The direction of the tapers is chosen to provide increasing channel width toward the center access region in both source and drain contacts 1040, 1042, which serve to direct collected current down the path of least electrical resistance, i.e. toward the gate contact terminal 1050.

In the transistor 1000, a first ohmic contact 1062 is formed by the source contact terminal 1040, series of laterally tapered trenches 1030, and portions of the first semiconductor layer 1010, heterointerface 1021, two-dimensional electron sheet region 1020, and second semiconductor layer 1012 underneath the source contact terminal 1040. A second ohmic contact 1064 is formed by the drain contact terminal 1042, series of laterally tapered trenches 1031, and portions of the first semiconductor layer 1010, heterointerface 1021, two-dimensional electron sheet region 1020, and second semiconductor layer 1012 underneath the drain contact terminal 1042.

Figure 11:
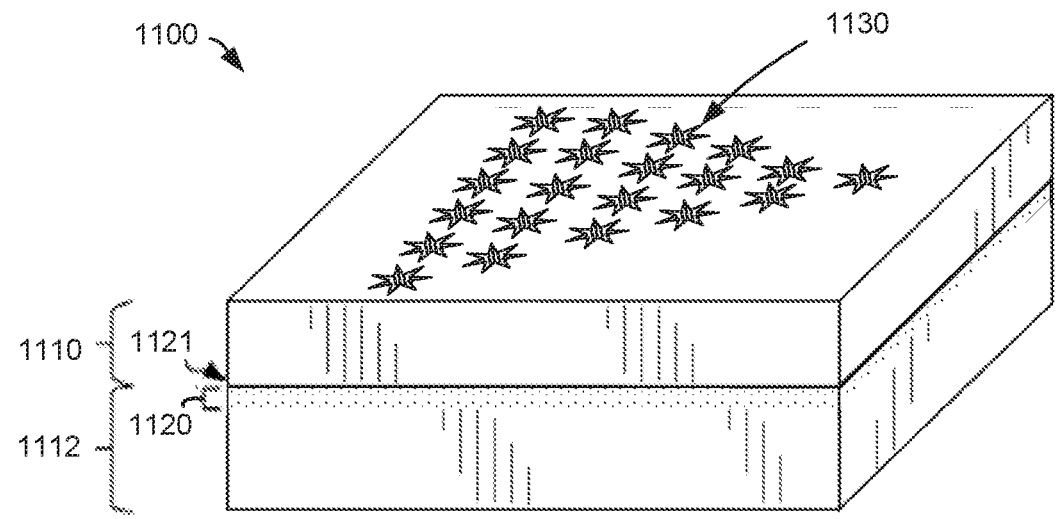
FIG. 11 is a perspective view of an example ohmic contact with a laterally tapered array of holes (e.g., starburst shape) to serve as direct access pathways to a two-dimensional electron sheet.

An example of an ohmic contact having with a laterally tapered array of holes (e.g., starburst shape) to serve as direct access pathways between an electrode and a two-dimensional electron sheet is shown in FIG. 11, indicated generally at 1100. The ohmic contact 1100 includes a first semiconductor layer 1110, a second semiconductor layer 1112, a heterointerface 1121, a two-dimensional electron sheet region 1120, and a laterally tapered array of spaced holes 1130.

Figure 12:
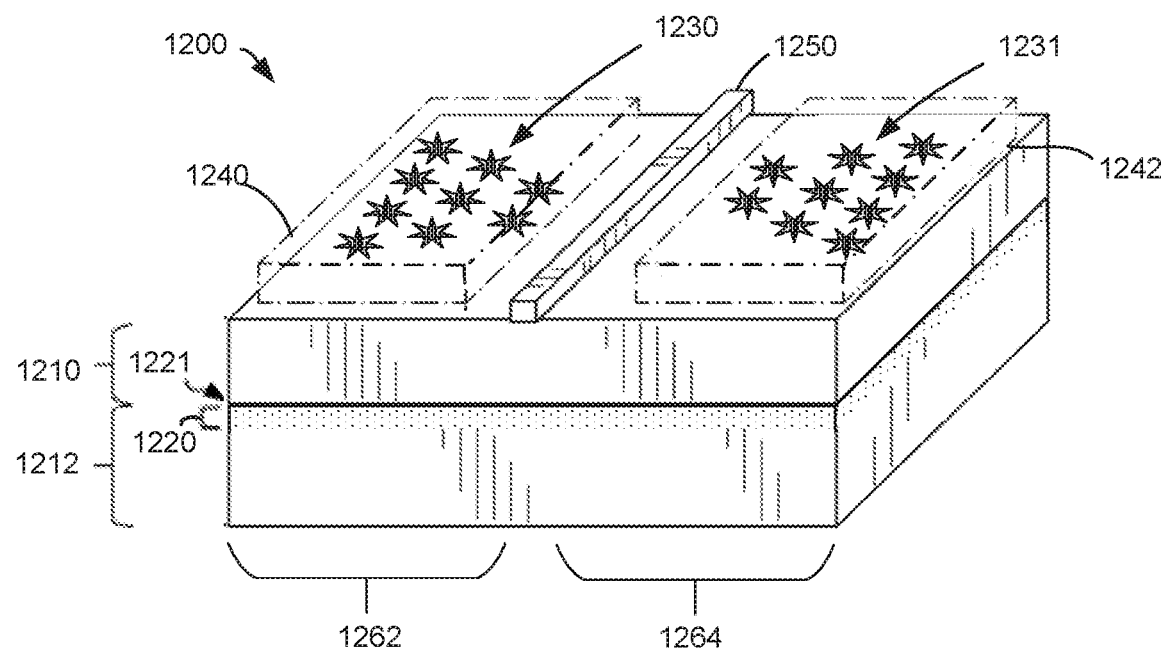
FIG. 12 is a perspective view of an example HEMT having source and drain ohmic contacts with laterally tapered arrays of holes thereunder serving as direct access pathways to a two-dimensional electron sheet.

Further, an example of a HEMT with a laterally tapered array of spaced holes serving as direct access pathways between two metal terminals and a two-dimensional electron sheet is shown in FIG. 12, indicated generally at 1200. The transistor 1200 includes a first semiconductor layer 1210, a second semiconductor layer 1212, a heterointerface 1221, a two-dimensional electron sheet region 1220, a source contact terminal 1240, a drain contact terminal 1242, a gate contact terminal 1250, and laterally tapered arrays of holes 1230, 1231, beneath the terminals 1240, 1242, respectively. The terminals 1240, 1242 are shown in broken lines for viewing of the holes 1230, 1231.

In the transistor 1200, a first ohmic contact 1262 is formed by the source contact terminal 1240, laterally tapered array of 1230, and portions of the first semiconductor layer 1210, heterointerface 1221, two-dimensional electron sheet region 1220, and second semiconductor layer 1212 underneath the source contact terminal 1240. A second ohmic contact 1264 is formed by the drain contact terminal 1242, laterally tapered array of spaced holes 1231, and portions of the first semiconductor layer 1210, heterointerface 1221, two-dimensional electron sheet region 1220, and second semiconductor layer 1212 underneath the drain contact terminal 1242.

The graded density of the laterally tapered arrays of spaced (e.g., starburst) holes 1230, 1231, having lowest density of removed (etched) material closest to the access region, may provide similar attributes as the laterally tapered trenches 1030, 1031.

Returning to FIG. 3 and FIGS. 4A, 4B, and 4C, at block 306, a metal electrode material is deposited to fill the plurality of direct access pathways 430 and to cover the first semiconductor layer 410 to form a metal terminal 440, the metal terminal 440 making direct lateral contact with the two-dimensional electron sheet region 420. The metal terminal 440 thus forms a plurality of fingers or prongs which fill the direct access pathways 430. The metal terminal 440 may be used as a source contact terminal or a drain contact terminal of a HEMT. Non-uniformities in the fabrication process may result in not all of the direct access pathways 430 being filled with the metal material.

Thus, a low resistance ohmic contact with good edge definition may be fabricated without annealing at high temperature and without etching away a recessed ohmic area. The ohmic contact is fabricated by etching a plurality of direct access pathways through the barrier and into a region in which the two-dimensional electron sheet forms.

It should be recognized that features and aspects of the various examples provided above can be combined into further examples that also fall within the scope of the present disclosure. The scope of the claims should not be limited by the above examples but should be given the broadest interpretation consistent with the description as a whole.

The invention claimed is:

1. An ohmic contact comprising: a first semiconductor layer of a first semiconductor material; a second semiconductor layer of a second semiconductor material, the second semiconductor material having a different band gap than the first semiconductor material and wherein a heterointerface is formed between the first semiconductor layer and the second semiconductor layer, the second semiconductor layer including a two-dimensional electron sheet region in which a two-dimensional electron sheet is formed; a plurality of direct access pathways passing through the first semiconductor layer to reach the two-dimensional electron sheet region; and a metal terminal covering the first semiconductor layer and filling the plurality of direct access pathways to make direct lateral contact with the two-dimensional electron sheet region, wherein the plurality of direct access pathways comprises an array of polygonal holes, and wherein the polygonal holes are hexagonal.

2. The ohmic contact of claim 1, wherein the plurality of direct access pathways travel past the heterointerface by a buffer depth.

3. The ohmic contact of claim 1, wherein the first semiconductor material comprises aluminum gallium nitride and the second semiconductor material comprises gallium nitride.

4. The ohmic contact of claim 1, wherein the metal terminal comprises one of a source contact terminal and a drain contact terminal of a high-electron-mobility transistor (HEMT).

5. A method of fabricating an ohmic contact, the method comprising: providing a first semiconductor layer of a first semiconductor material and a second semiconductor layer of a second semiconductor material, the second semiconductor material having a different band gap than the first semiconductor material and wherein a heterointerface is formed between the first semiconductor layer and the second semiconductor layer, the second semiconductor layer including a two-dimensional electron sheet region in which a two-dimensional electron sheet is formed; etching a plurality of direct access pathways passing through the first semiconductor layer to reach the two-dimensional electron sheet region; and depositing a metal material to fill the plurality of direct access pathways and to cover the first semiconductor layer to form a metal terminal making direct lateral contact with the two-dimensional electron sheet region, wherein etching the plurality of direct access pathways comprises etching array of spaced polygonal holes to form the plurality of direct access pathways, and wherein the spaced polygonal holes are hexagonal.

6. The method of claim 5, wherein etching the plurality of direct access pathways comprises etching past the heterointerface by a buffer depth.

7. The method of claim 5, wherein the first semiconductor material comprises aluminum gallium nitride and the second semiconductor material comprises gallium nitride.

8. The method claim 5, wherein the metal terminal comprises one of a source contact terminal and a drain contact terminal of a high-electron-mobility transistor (HEMT).

9. A high-electron-mobility transistor (HEMT) comprising: a drain contact terminal; a source contact terminal; a gate contact terminal to receive a voltage to control a flow of electrical current between the drain contact terminal and the source contact terminal; a barrier of a first semiconductor material; a channel of a second semiconductor material, the second semiconductor material having a different band gap than the first semiconductor material and wherein a heterointerface is formed between the barrier and the channel, the channel including a two-dimensional electron sheet region in which a two-dimensional electron sheet is formed; and a plurality of direct access pathways passing through the barrier to provide the drain contact terminal and the source contact terminal with direct lateral contact to the two-dimensional electron sheet region wherein the plurality of direct access pathways comprises an array of spaced polygonal holes, and wherein the spaced polygonal holes are hexagonal.

10. The transistor of claim 9, wherein the plurality of direct access pathways travel past the heterointerface by a buffer depth.

11. The transistor of claim 9, wherein the first semiconductor material comprises aluminum gallium nitride and the second semiconductor material comprises gallium nitride.

* * * * *